United States Patent [19]
Hsia et al.

[11] Patent Number: 5,827,783
[45] Date of Patent: Oct. 27, 1998

[54] STACKED CAPACITOR HAVING IMPROVED CHARGE STORAGE CAPACITY

[75] Inventors: Liang-Choo Hsia, Taipei; Thomas Chang, Hsin-Chu, both of Taiwan

[73] Assignee: Mosel Vitelic, Inc., Hsinchu, Taiwan

[21] Appl. No.: 697,443

[22] Filed: Aug. 23, 1996

[51] Int. Cl.⁶ .................................................. H01L 21/465
[52] U.S. Cl. .......................... 438/735; 438/734; 438/396; 438/397; 438/712; 438/210; 216/6
[58] Field of Search ..................................... 216/6, 70, 72; 437/60, 228 ES, 228 SJ, 228 TR, 238, 240, 919; 438/210, 712, 714, 734, 735, 396, 397, 399

[56] References Cited

U.S. PATENT DOCUMENTS

| | | | |
|---|---|---|---|
| 5,316,982 | 5/1994 | Taniguchi | 437/236 |
| 5,330,928 | 7/1994 | Tseng | 437/52 |
| 5,347,696 | 9/1994 | Willer et al. | 29/25.42 |
| 5,384,276 | 1/1995 | Ogawa et al. | 438/52 |
| 5,395,784 | 3/1995 | Lu et al. | 437/52 |
| 5,573,967 | 11/1996 | Tseng | 437/52 |

Primary Examiner—M. Nuzzolillo
Assistant Examiner—Steven H. VerSteeg
Attorney, Agent, or Firm—Tung & Associates

[57] ABSTRACT

A method of forming a capacitor that has improved charge storage capacity in a high density memory device that has shallow trench isolation regions and a capacitor produced by the method are provided. The method includes the step of forming an oxide spacer that consists of a plurality of oxide layers deposited by two alternating methods of thermal CVD and plasma CVD. After a contact hole is first etched by a plasma etching technique, the hole is again decoratively etched by an etchant such as hydrogen fluoride which has a high selectivity toward oxide layers formed by the plasma CVD method and a low selectivity toward oxide layers formed by the thermal CVD method. As a result, a corrugated side-wall of the contact hole is formed which affords the capacitor cell with an increased surface area leading to an improved charge storage capacity.

15 Claims, 2 Drawing Sheets

STACKED CAPACITOR HAVING IMPROVED CHARGE STORAGE CAPACITY

FIELD OF THE INVENTION

The present invention generally relates to a stacked capacitor in a memory device formed adjacent to a shallow trench isolation and more particularly, relates to a stacked capacitor in a high density memory device formed adjacent to a shallow trench isolation wherein the capacitor has a corrugated side-wall structure such that the side-wall area is increased to improve the charge storage capacity of the capacitor.

BACKGROUND OF THE INVENTION

In modern memory devices, small dimension and high capacitance value per unit area of a capacitor are desirable characteristics for achieving high charge storage capacity. The capacitors are usually formed by at least two layers of a semiconducting material and one layer of a dielectric material. For instance, in a polysilicon capacitor which is widely used in DRAM (dynamic random access memory) applications, a thin oxide layer is used to form an oxide sandwich between two polysilicon layers to produce a high capacitance capacitor cell.

In memory devices such as DRAM, while the dimensions of the device are continuously been miniaturized, methods for reducing the chip real estate occupied by a capacitor become more important. One such method proposed by others encompassing a design of stacking a capacitor over the bit line on the surface of a silicon substrate. The stacked capacitor is formed by a layer of dielectric material such as silicon oxide or oxide-nitride-oxide sandwiched between two layers of polysilicon. The effective capacitance of a stacked cell is increased over that of a convention planar cell due to its increased surface area. A conventional method of fabricating a stacked capacitor for DRAM is shown in FIGS. 1–5.

As shown in FIG. 1, a transistor 10 is first formed on a surface of the silicon substrate 12. A shallow trench field oxide layer 14 is also formed in the surface of the silicon substrate 12. A silicon nitride etch-stop layer 16 is then blanket deposited on the surface. This is shown in FIG. 2. Shallow trench isolation can be suitably used in high density (e.g. 64 M or larger) memory devices since it provides simplified back-end operation such as packaging. This is in comparison to a bird's beak type LOCOS isolation which provides an uneven top surface (or uneven topography) on a memory device and leads to poor photolithographic results due to focusing difficulties. Shallow trench isolation can be etched in the silicon between neighboring devices. It allows the devices to be built much closer together without the problem of effective channel width control since a field implant is no longer needed. The width of a device can be well defined by surrounding trenches without additional processing steps for the field implant. A more planar surface on the device can also be obtained by the absence of formation of bird's beak. Based on the advantages of a tighter line definition and a greater planarity provided by the shallow trench isolation, the isolation is very suitable for applications in sub-half-micron semiconductor processes.

In the next step of fabrication, as shown in FIG. 3, an oxide layer 18, or a cell contact non-doped silicate glass (CCNSG), is blanket deposited on the IC device. The CCNSG layer 18 is then patterned, photomasked and etched to form a cell contact hole 22, as shown in FIG. 4. After the formation of the cell contact hole 22, a layer of polysilicon 24, a layer of dielectric material (such as silicon oxide or oxide-nitride-oxide) 26 are deposited. This is shown in FIG. 5. After the two layers are patterned and etched by conventional processes to define the capacitor cell, a polysilicon layer 28 is deposited and then patterned and etched to define the capacitor cell 30.

In this conventional method, even though the side-wall thickness of the capacitor cell 30 is increased by the addition of the CCNSG layer 18, the limiting factor for the increased capacitance of the cell is the height of the cell that can be allowed.

It is therefore an object of the present invention to provide a capacitor cell in a DRAM device that has improved capacitance without significantly increases the cell height.

It is another object of the present invention to provide a capacitor cell in a DRAM device having improved charge capacity that does not require the deposit of a thicker CCNSG layer to increase the side-wall thickness of the cell.

It is a further object of the present invention to provide a capacitor cell in a DRAM device that incorporates the deposition of a plurality of oxide layers in place of a single CCNSG layer while maintaining the total height of the cell.

It is still another object of the present invention to provide a capacitor cell in a DRAM device that has enhanced side-wall area by the incorporation of a plurality of oxide layers wherein each layer is deposited by a deposition technique different than that used for depositing its immediate adjacent layers.

It is yet another object of the present invention to provide a capacitor cell for a DRAM device that has enhanced side-wall area by the incorporation of a plurality of oxide layers wherein each alternating layer is deposited by a different technique selected from a thermal CVD technique and a plasma CVD technique.

It is still another object of the present invention to provide a capacitor cell in a DRAM device that has enhanced side-wall area by incorporating a plurality of oxide layers wherein each layer has a density that is different than its immediately adjacent layers.

It is still another further object of the present invention to provide a capacitor cell in a DRAM device that has enhanced side-wall area by incorporating a plurality of oxide layers which can be etched by an etchant having different etch selectivity for the different oxide layers.

It is yet another further object of the present invention to provide a capacitor cell in a DRAM device that has enhanced side-wall area by incorporating a plurality of oxide layers that produce a corrugated configuration in the side-wall after an etching process.

It is yet another further object of the present invention to provide a capacitor cell in a DRAM device that has enhanced side-wall area by incorporating a plurality of oxide layers wherein the layers are etched by an acid having an etch selectivity ratio of at least 1:2 for the different oxide layers.

SUMMARY OF THE INVENTION

The present invention provides a method of fabricating a capacitor cell for a memory device having shallow trench isolation regions where the cell has an enhanced thickness and a corrugated configuration in the side-wall for maximizing the surface area in order to increase the capacitance of the capacitor cell while maintaining its vertical dimension. The present invention also provides a capacitor cell in a DRAM device fabricated from such method.

In the preferred embodiment, a semiconductor substrate is first provided and then a gate and a shallow trench isolation are formed on the surface on the substrate. Next, a plurality of oxide layers are deposited overlying the gate and the shallow trench isolation by a deposition method alternating between a thermal CVD method and a plasma CVD method for each of the layers. The plurality of oxide layers are then etched through to form a capacitor cell contact in a contact etch process by using a plasma etching technique. The plurality of oxide layers having a capacitor cell contact etched therein are then decoratively etched by an etchant that has sufficient etch selectivity difference between the thermal CVD formed and the plasma CVD formed oxide layers such that a corrugated configuration is formed in the cell opening. Polysilicon and dielectric layers are then deposited in the capacitor cell to form the capacitor.

The present invention also provides a capacitor in a DRAM device that has improved charge storage capacity which includes the components of a semiconducting substrate, a gate on and a shallow trench isolation in the surface of the substrate, a plurality of oxide layers overlying the gate and the shallow trench isolation wherein each alternating layer has a density that is different than the density of its immediate adjacent layers, a capacitor cell contact formed in the plurality of oxide layers to expose the substrate wherein the plurality of oxide layers having edges exposed in the cell opening in a corrugated configuration, and at least two layers of a semiconducting material and a layer of a dielectric material deposited in the cell opening to form the capacitor.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Increased capacitor charge storage is an important aspect in future modern DRAM designs. One method to improve charge storage is to increase the area of the storage node without increasing the overall horizontal cell dimensions. The present invention provides a vertically corrugated sidewall structure of an oxide spacer to enlarge the memory cell area. The fabrication method employs an alternating deposition of thermal CVD and plasma CVD oxide layers and selectively wet etch the layers.

Figure 6:
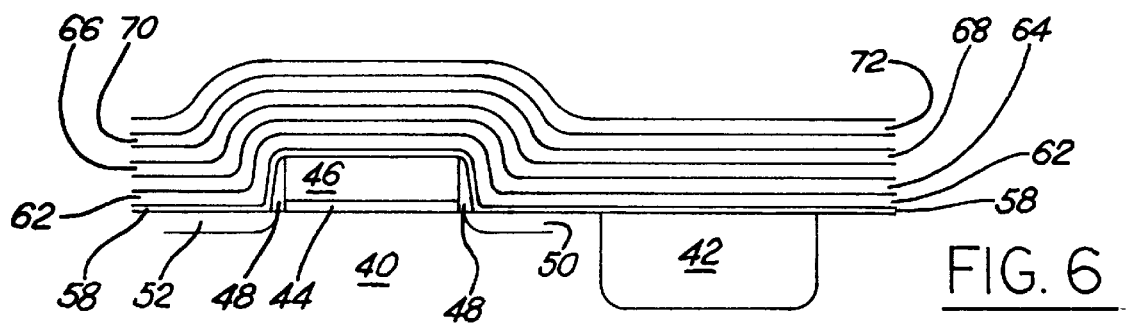
FIG. 6 is an enlarged, cross-sectional view of the present invention substrate having a plurality of oxide layers deposited on top.
Figure 7:
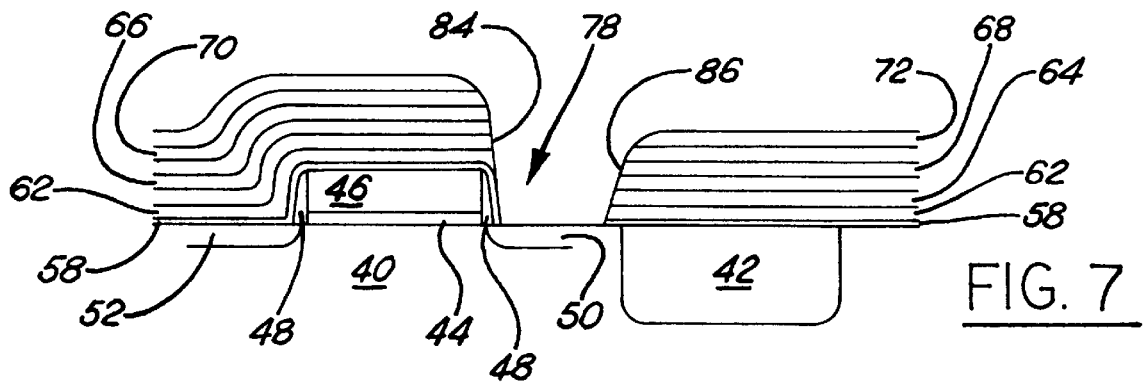
FIG. 7 is an enlarged, cross-sectional view of the present invention substrate shown in FIG. 6 having a contact cell etched on the substrate.

In accordance with the present invention, a method of forming a capacitor having improved charge storage capability and a capacitor formed thereof are provided. Referring initially to FIG. 6, wherein a P type substrate 40 of a semiconducting material is shown. On the semiconducting substrate 40, a shallow trench isolation 42 is first formed to a thickness between about 3000 Å and about 5500 Å by a thermal oxidation process. The shallow trench isolation 42 is used to isolate the IC devices to be formed on substrate 40. A metal oxide FET (field effect transistor) consisting of a gate oxide layer 44, a gate electrode 46, side-wall spacers 48 and $N^+$ doped source 50/drain 52 are formed on the P type substrate 40. The gate oxide layer 44 is formed by a thermal oxidation process on the surface of substrate 40 to a thickness between about 50 Å and 200Å. The gate electrode 46 is generally formed by a low pressure chemical vapor deposition (LPCVD) process wherein a polysilicon layer of about 1000 Å~3000 Å thickness is first deposited followed by the deposition of an oxide layer (not shown) by a second LPCVD process from a reactant gas mixture of TEOS, $N_2O$ and $O_2$. The oxide layer which has a thickness between about 500 Å and about 1200 Å is deposited at a reaction temperature of about 720° C. and a chamber pressure of about 250 mTorr. After the deposition of the oxide layer, the gate 46 is formed by photolithography and etching processes to etch away the unnecessary oxide and polysilicon. An ion implantation process utilizing phosphorus ions is then carried out to form the $N^-$ lightly doped source and drain regions (not shown).

In the next fabrication step, dielectric layer is deposited and etched by an isotropic etching process to form sidewall spacers 48 on the gate electrode 46. The dielectric layer is generally deposited of silicon dioxide by a LPCVD process with a reactant gas mixture of TEOS, $N_2O$ and $O_2$. The thickness of the dielectric layer deposited is between about 500 Å and about 1500 Å. An ion implantation technique is then used to form $N^+$ heavily doped source 50/drain 52 regions with arsenic ions. The ion dosage is between about 1E15 and about 3E16 ions/cm$^2$ applied at an implantation energy of between about 30 teev and about 90 teev. The transistor structure is thus completed.

As shown in FIGS. 1–5, in a conventional capacitor cell structure, a non-doped oxide 18 is used as the cell contact hole side-wall material and for insulating from the silicon substrate. The present invention provides a method of depositing an oxide spacer on top of a conventionally deposited cell contact non-doped silicate glass (CCNSG) layer 62. A thin nitride etch-stop layer 58 is deposited prior to the deposition of the oxide spacer to protect the CCNSG layer during the oxide etching process.

The nitride etch-stop layer should be removed before the cell contact is formed. The oxide spacer is made up of a plurality of oxide layers that are deposited by alternating thermal CVD and plasma CVD methods. The plurality of oxide layers is at least two layers, or between 2 and 20 layers. The plasma etching technique is selected from a magnetically enhanced reactive ion etching technique, an electron cyclotron resonance technique and a reactive ion etching technique. As shown in FIG. 6, layers 64, 68 and 72 are deposited by a thermal CVD method which can be conducted at a chamber temperature of 300° C. or higher. For instance, by the reaction of 1. Cold wall or LPCVD method

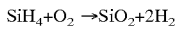

Temperature: 300° C. ~1000° C.
Pressure: 0.03τ~760τ
2. APCVD Method

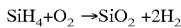

Temperature ≅400° C.
3. SACVD Method

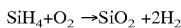

Temperature ≅500° C.

4. TEOS Decomposition Method

Temperature: 650° C.~700° C.
Pressure: 1τ~760τ
5. Dichlorosilane Method

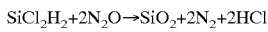

Temperature: 900° C.
Pressure: 1τ~760τ

The thickness for each individual layer is in the range between about 100 Å and about 500 Å.

Alternatingly, layers 58, 60 and 62 are deposited by a plasma CVD method wherein the deposition temperature is between 25° C. and 700° C. For instance,

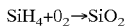

Temperature:=300° C. in argon gas

Pressure=ambient
n=1.46

Temperature=380° C. in nirogen gas
Pressure=ambient
n=1.50
Pressure: 0.1~5 Torr
Temperature: 25° C.~700° C.
RF frequency: 25~450 kHz 13.56 MHz 27 MHz
RF power coupling capacitively or inductively. The dielectric constant n ranges from 1.4~1.55

Figure 1:
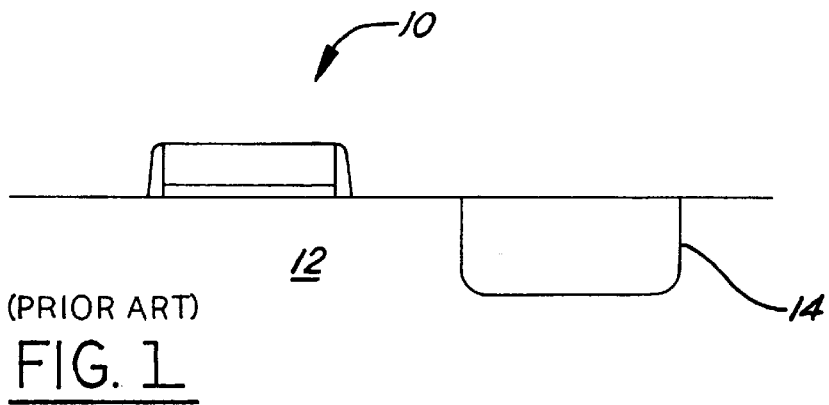
FIG. 1 is an enlarged, cross-sectional view of a conventional transistor gate and a shallow trench isolation on the surface of a substrate.
Figure 2:
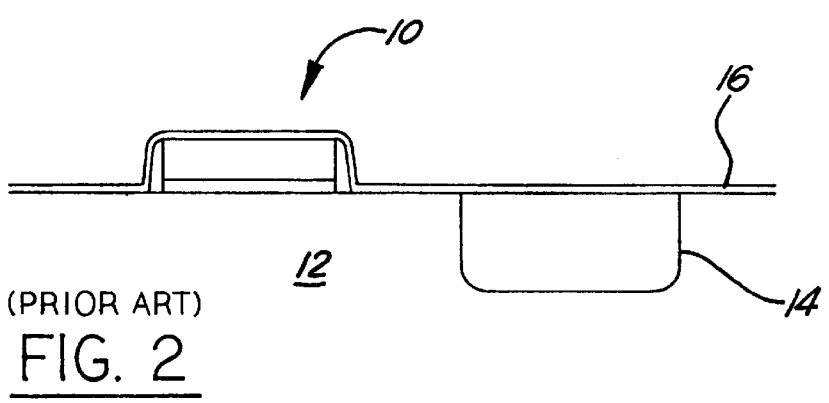
FIGS. 2 is an enlarged, cross-sectional view of the conventional substrate shown in FIG. 1 having a layer of silicon nitride etch-stop blanket deposited on top.
Figure 3:
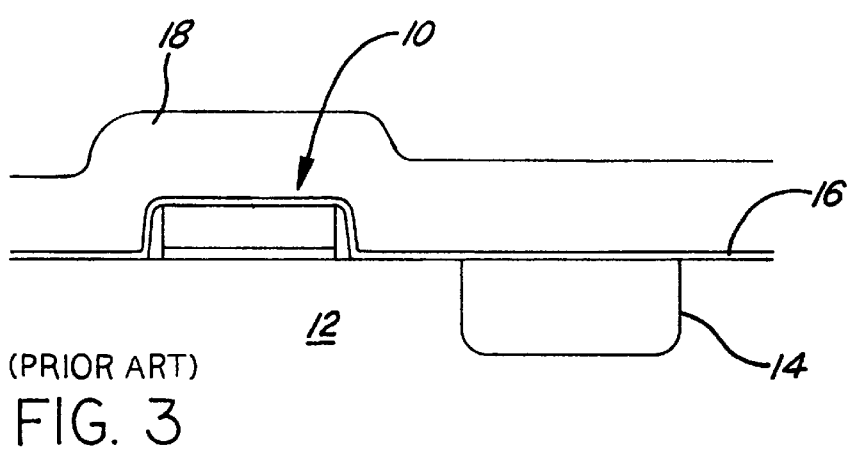
FIG. 3 is an enlarged, cross-sectional view of the conventional substrate shown in FIG. 2 having another layer of cell contact non-doped silicate glass blanket deposited on top of the etch-stop layer.
Figure 4:
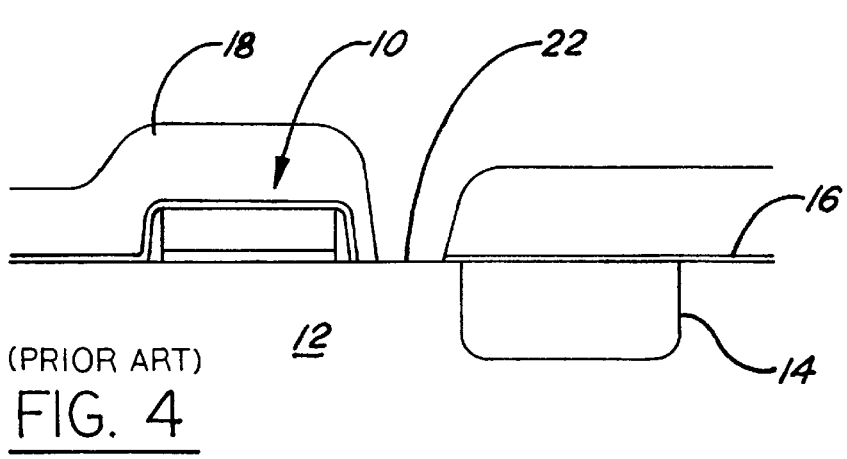
FIG. 4 is an enlarged, cross-sectional view of the conventional substrate shown in FIG. 3 having a cell contact etched in the capacitor cell.
Figure 5:
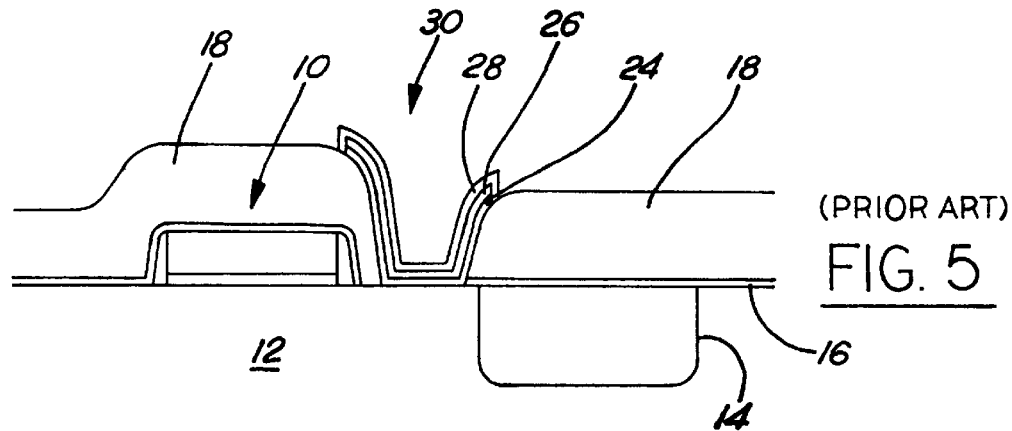
FIG. 5 is an enlarged, cross-sectional view of the conventional substrate shown in FIG. 4 having a capacitor formed in the cell contact.

It has also been discovered that TEOS oxide is not preferred in the present invention method. A suitable thickness for the individual layers of plasma CVD oxide is between about 100 Å and about 500 Å, preferably between about 200 Å and about 400 Å. The total thickness for all the oxide layers shown in FIG. 4 is in the range between about 500 Å and about 5000 Å, preferably between about 1000 Å and about 3000 Å.

The thermal CVD deposition and the plasma CVD deposition of oxide layers can be conducted in a standard deposition chamber such as that made by Applied Materials, Inc. model P5000.

After the alternating layers of oxide are deposited, cell contact patterning and photolithographic processes are carried out on the top oxide layer 56. By utilizing a plasma etching 13 (or reactive ion etching) technique which stops at the nitride etch-stop layer, a straight contact hole 66 is formed to expose a contact area 68 of silicon substrate. The side walls 70 and 72 of the contact hole are relatively smooth after the plasma etching process since the plasma has no selectivity between the oxide layers formed by the thermal CVD method and by the plasma CVD method.

Figure 8:
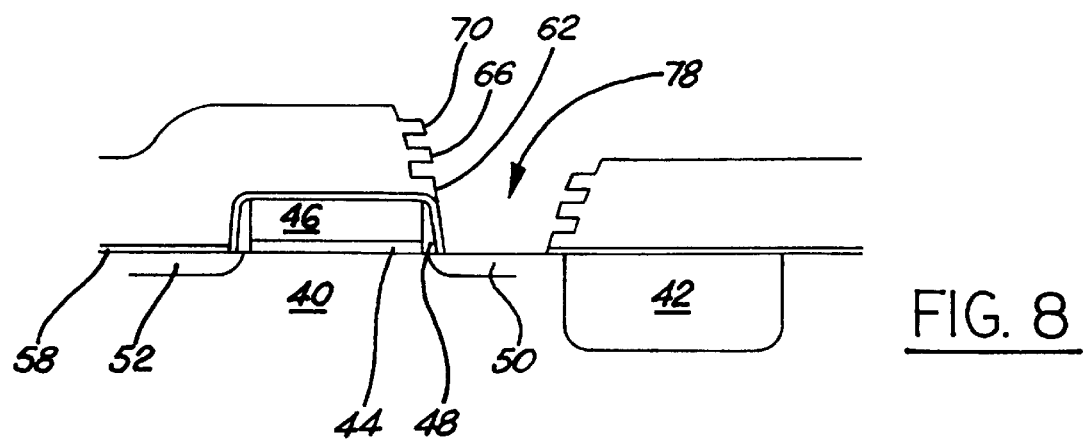
FIG. 8 is an enlarged, cross-sectional view of the present invention substrate shown in FIG. 7 having a multiplicity of oxide layers etched by an etchant of different selectivities to form a corrugated surface configuration.

In a subsequent hydrogen fluoride wet etch process (also called a HF wet decoration process), based on the different densities of the oxide layers formed by the thermal CVD method and by the plasma CVD method, the etch selectivity between thermal CVD and plasma CVD in an acid-based etchant such as hydrogen fluoride is approximately 1:4. The sufficient etch selectivity between the thermal CVD and the plasma CVD oxide layers is at least about 1:2. As shown in FIG. 8, after a wet etching process is carried out in HF, the side-walls 84 and 86 of the contact hole 78 are etched into a corrugated configuration. The enchant HF has higher selectivity toward the oxide layers formed by the plasma CVD method and a lower selectivity toward the oxide layers formed by the thermal CVD method. It is believed that the densities of the two types of films formed are different by at least about 10%. As a result, the oxide layers formed by the plasma CVD method are etched less severely that the oxide layers formed by the thermal CVD method leading to a corrugated configuration in the side-walls. This corrugated side-wall substantially increases the surface area available on the side-wall of the capacitor cell. The etch selectivity of the oxide layers can also be controlled by the processing parameters used in the deposition process. For instance, the gap (or the electrode spacing), the reactant gas pressure and the plasma power level can influence the properties of the oxide film obtained and consequently, its etch selectivity.

In the subsequent fabrication steps, the nitride and CCNSG layers are etched away at the cell contact area. Node polysilicon (2P) of approximately 1000 Å~2000 Å thick is deposited and in-situ doped to form a node. After a 2P photolithographic process and a 2-P etch process, wet acid (hydrogen fluoride) is used to strip the oxide layer which stops at the nitride layer. A layer of thin rugged polysilicon is then deposited and in-situ doped thin dielectric layer of oxide-nitride-oxide (or oxynitride) of approximately 30 Å~100 Å thickness is then deposited on top. In the last fabrication step, a 3P polysilicon (or a capacitor plate layer) having a thickness of approximately 1500 Å~3000 Å is deposited on top to form the capacitor cell 78. A capacitor cell that has substantially improved charge storage capability is thus achieved by the present invention method. After standard polysilicon layers and a dielectric layer (not shown) are deposited into the contact hole 78, a capacitor cell that has substantially improved charge storage capability is formed. The present invention method of forming a capacitor that has improved charge storage capacity can be summarized by the following steps of first providing a substrate of a semiconducting material, then forming a gate on a shallow trench isolation in the surface of the substrate, then blanket depositing a layer of a cell contact non-doped silicate glass overlying the gate and the shallow trench isolation, then blanket depositing a plurality of oxide layers overlying the cell contact non-doped silicate glass layer by a deposition method alternating between a thermal CVD and a plasma CVD technique, then etching through the plurality of oxide layers and the non-doped silicate glass layer to form a capacitor cell contact and to expose the edges of the plurality of oxide layers by a plasma etching technique, then etching the edges of the plurality of oxide layers by an etchant which has sufficient etch selectivity between the thermal CVD oxide layers and the plasma CVD oxide layers such that a corrugated sidewall is formed in the capacitor cell after the etching step, and depositing semiconducting and dielectric layers in the capacitor cell to form the capacitor.

It should be noted that hydrofluoric acid is illustrated as one example of the wet enchant that has the proper selectivity between the oxide layers prepared by the different techniques. Other etchants that perform similarly with suitable selectivity between the oxide layers may also be used to achieve the same desirable result achieved by hydrogen fluoride.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

We claim:

1. A method of fabricating a stacked capacitor having improved charge storage capacity wherein the capacitor is formed adjacent to a trench isolation in a semiconductor device comprising the steps of:

providing a substrate of a semiconducting material, forming a gate on and a trench isolation in the surface of the substrate, depositing a plurality of silicon dioxide layers overlying the gate and the trench isolation by a deposition method alternating between a thermal chemical vapor deposition (CVD) technique and a plasma CVD technique, etching through said plurality of silicon dioxide layers to form a capacitor cell contact between the gate and the shallow trench isolation to expose edges of said silicon dioxide layers by a first etchant which has no selectivity between said thermal CVD silicon dioxide layers and said plasma CVD silicon dioxide layers, etching said exposed edges of said silicon dioxide layers by a second etchant which has sufficient etch selectivity between said thermal CVD silicon dioxide layers and said plasma CVD silicon dioxide layers such that a corrugated side-wall is formed in said capacitor cell after said etching step, and depositing semiconducting and insulating layers in said capacitor to form said capacitor.

2. A method according to claim 1, wherein said etching step utilizing said first etchant comprises a plasma etching technique.

3. A method according to claim 2, wherein said plasma etching technique is selected from the group consisting of a magnetically enhanced reactive ion etching technique, an electron cyclotron resonance technique and a reactive ion etching technique.

4. A method according to claim 1, wherein said plurality of silicon dioxide layers comprises at least two layers.

5. A method according to claim 4, wherein said plurality of silicon dioxide layers comprises between 2 and 20 layers.

6. A method according to claim 1, wherein an acid used in the etching comprises HF.

7. A method according to claim 1 further comprising the step of depositing a layer of cell contact non-doped silicate glass before the deposition step of said plurality of silicaon dioxide layers.

8. A method of fabricating a stacked capacitor having improved charge storage capacity wherein the capacitor is formed adjacent to a trench isolation in a semiconductor device comprising the steps of:

providing a substrate of a semiconducting material, forming a gate on and a trench isolation in the surface of the substrate, depositing a plurality of oxide layers overlying the gate and the trench isolation by a deposition method alternating between a thermal chemical vapor deposition (CVD) technique and a plasma CVD technique, etching through said plurality of oxide layers to form a capacitor cell contact between the gate and the trench isolation to expose edges of said oxide layers by a first etchant which has no selectivity between said thermal CVD oxide layers and said plasma CVD oxide layers, etching said exposed edges of said oxide layers by a second etchant which has an etch selectivity between said thermal CVD oxide layers and said plasma CVD oxide layers of at least about 1:2 such that a corrugated side-wall is formed in said capacitor cell after said etching step, and depositing semiconducting and insulating layers in said capacitor cell to form said capacitor.

9. A method according to claim 8, wherein said etchant is HF and said etch selectivity between said thermal CVD and said plasma CVD oxide layers is about 1:4.

10. A method of fabricating a stacked capacitor having improved charge storage capacity wherein The capacitor is formed adjacent to a trench isolation in a semiconductor device comprising the steps of:

providing a substrate of a semiconducting material, forming a gate on and a tench isolation in the surface of the substrate, depositing a plurality of oxide layers overlying the gate and the trench isolation by a deposition method alternating between a thermal chemical vapor deposition (CVD) technique and a plasma CVD technique said plurality of oxide layers having a total thickness between about 500 Å and about 5000 Å, etching through said plurality of oxide layers to form a capacitor cell contact between the gate and the trench isolation to expose edges of said oxide layers by a first etchant which has no selectivity between said thermal CVD oxide layers and said plasma CVD oxide layers, etching said exposed edges of said oxide layers by a second etchant which has sufficient etch selectivity between said thermal CVD oxide layers and said plasma CVD oxide layers such that a corrugated side-wall is formed in said capacitor cell after said etching step, and depositing semiconducting and insulating layers in said capacitor cell to form said capacitor.

11. A method according to claim 10 wherein said plurality of oxide layers having a total thickness between about 1000 Å and about 3000 Å.

12. A method of fabricating a stacked capacitor having improved charge storage capacity wherein the capacitor is formed adjacent to a trench isolation in a semiconductor device comprising the steps of:

providing a substrate of a semiconducting material, forming a gate on and a trench isolation in the surface of the substrate, depositing a plurality of oxide layers overlying the gate and the trench isolation by a deposition method alternating between a thermal chemical vapor deposition (CVD) technique and a plasma CVD technique, said plurality of oxide layers each having a thickness between about 100 Å and about 500 Å, etching through said plurality of oxide layers to form a capacitor cell contact between the gate and the trench isolation to expose edges of said oxide layers by a first etchant which has no selectivity between said thermal CVD oxide layers and said plasma CVD oxide layers, etching said exposed edges of said oxide layers by a second etchant which has sufficient etch selectivity between said thermal CVD oxide layers and said plasma CVD oxide layers such that a corrugated side-wall is formed in said capacitor cell after said etching step, and depositing semiconducting and insulating layers in said capacitor cell to form said capacitor.

13. A method according to claim 12 wherein said plurality of oxide layers having a thickness between about 200 Å and about 400 Å.

14. A method of forming a capacitor having improved charge storage capacity comprising the steps of:

providing a substrate of a semiconducting material, forming a gate on a trench isolation in the surface of the substrate, blanket depositing a layer of a cell contact non-doped silicate glass overlying said gate and said trench isolation, blanket depositing a plurality of silicon dioxide layers overlying said cell contact non-doped silicate glass layer by a deposition method alternating between a thermal CVD technique and a plasma CVD technique, etching through said plurality of silicon dioxide layers and said non-doped silicate glass layer to form a capacitor cell contact and to expose the edges of said plurality of silicon dioxide layers by a plasma etching technique, etching the edges of said pluraltiy of silicon dioxide layers by an etchant having sufficient etch selectivity between said thermal CVD silicon dioxide layers and said plasma CVD silicon dioxide layers such that a corrugated side-wall is formed in said capacitor cell after said etching step, and depositing semiconducting and dielectric layers in said capacitor cell to form said capacitor.

15. A method to claim 14 further comprising the step of depositing a nitride etch-stop layer prior to the deposition of silicon dioxide layers.

* * * * *